(12) United States Patent
Yoshizawa

(10) Patent No.: US 6,420,804 B1
(45) Date of Patent: Jul. 16, 2002

(54) CIRCUIT FOR SWITCHING DIRECTION OF CURRENT

(75) Inventor: Nobukazu Yoshizawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/534,992

(22) Filed: Mar. 27, 2000

(30) Foreign Application Priority Data

Apr. 2, 1999 (JP) .............................. 11-095785

(51) Int. Cl.[7] .............................. H01K 3/28; G05F 1/10
(52) U.S. Cl. .............................. 307/140; 327/536
(58) Field of Search .............................. 307/140; 327/537, 327/536, 264, 403, 534; 326/21, 26, 27

(56) References Cited

U.S. PATENT DOCUMENTS 6,127,839 A * 10/2000 Martin et al. .............................. 326/27
6,294,947 B1 * 9/2001 Gabara .............................. 327/403

FOREIGN PATENT DOCUMENTS

| JP | 62-104492 | 5/1987 |
|----|-----------|--------|
| JP | 6-2941 | 1/1994 |
| JP | 6-90523 | 3/1994 |
| JP | 9-85251 | 3/1997 |

* cited by examiner

*Primary Examiner*—Rajnikant B. Patel
(74) *Attorney, Agent, or Firm*—Whitham, Curtis & Christofferson, PC

(57) ABSTRACT

To provide a circuit for switching over direction of current, which is capable of preventing an unwanted current other than a necessary current from flowing through a load and of reducing power consumption. A load is connected at one end to the ground and is connected at the other end to the connection between one end of a first switch and one end of a second switch. The first switch is connected at the other end to a positive current source and the second switch is connected at the other end to a negative current source. A direction in which a current flows through the load is changed over by selectively turning on any one of the first and second switches.

11 Claims, 3 Drawing Sheets

1; POSITIVE CURRENT SOURCE
2; NEGATIVE CURRENT SOURCE

CIRCUIT FOR SWITCHING DIRECTION OF CURRENT

FIELD OF THE INVENTION

The present invention relates to a current flowing direction switching circuit for switching a direction in which a current flows through a load.

BACKGROUND OF THE INVENTION

A current switching circuit for switching a current flowing through a load is disclosed in, for example, Japanese Patent Kokai Publication JP-A-6-90523, which proposes the configuration of a bidirectional current regulating circuit comprising a first and second switches connected to an output of the current regulating circuit, having respectively second and first terminals which are grounded, and respective common terminals which are connected to first and second output terminals, respectively, to which a load of an electronic control equipment is connected whereby the first and second switches are simultaneously switched by a drive circuit, so that the direction of a current appearing at the first and second output terminals is switched in response to a signal which is applied to a control input terminal which is connected to an input of the drive circuit. Since only unidirectional output is required as an output of the current regulating circuit, the necessity of two power sources including positive and negative power sources is eliminated.

SUMMARY OF THE DISCLOSURE

However, the following problems have been encountered in the course of the investigations toward the present invention. Namely, in order to change over the direction of a current flowing through a drive circuit, this prior art bidirectional current regulating circuit requires two-contact switches. If there is a variation in the operation time between two switches, the output of the current regulating circuit may be short-circuited to the ground (GND).

A transistor bridge circuit and a control circuit for controlling the same is disclosed in, for example, Japanese Patent Kokai Publication JP-A-62-104492, which teaches a circuit comprising a positive phase amplifier, inverting amplifier and NPN type transistors in which a voltage on a terminal of a current detecting resistor which is connected to a transistor bridge circuit is supplied to a subtracting circuit, said voltage having a polarity which is preset depending upon the direction of a current flowing through a motor, so that an eddy current which is induced in the motor is prevented from being induced irrespective of the direction of a current flowing through the motor. In this control circuit, a circuit for preventing the eddy current from occurring is complicated and is not capable of completely preventing the eddy current from occurring due to the variation in the operation time of the transistors when the operation speed is high.

An example of the configuration of a prior art current direction switching circuit is illustrated in FIG. 4. Referring now to FIG. 4, a two-terminal load (Z) 3 is connected at its one end to one end of a resistor R1 and a collector of a phototransistor Q2-1 which constitutes an NPN type photocoupler 5-1. The resistor R1 is further connected at the other end to a positive power source. The phototransistor Q2-1 has an emitter which is connected to a negative power source through an emitter resistor RE1. The load 3 is connected at the other end to one end of a resistor R2 and the collector of a phototransistor Q2-2 which constitutes an NPN type photocoupler 5-2. The resistor R2 is connected at the other end to a positive power source. The phototransistor Q2-2 has an emitter which is connected to a negative power source via an emitter resistor RE2. Reference numerals 6 and 7 denote drive circuits (buffer circuits) for driving the photodiodes D1 and D2, respectively.

If an input and output signals A and B assume Low and High levels, respectively, the photocoupler 5-2 could be turned off, a current would flow through a photocoupler 5-1, a current would flow from the positive power source through the resistor R2 and from the other end to the one end of the load 3, and a current would flow from the collector of the phototransistor Q2-1 through the emitter resistor RE1 to the negative power source. At this time, a current flows from the positive power source, also through the resistor R1 and the photo-diode Q2-1 to the negative power source.

If the input and output signals B and A assume the Low and High levels, respectively, the photocoupler 5-1 turns off and the photocoupler 5-2 turns on, a current would flow through diode D2 of the photocoupler 5-2, the phototransistor Q2-2 is turned on, a current would flow from the positive power source through the resistor R1 and from one end to the other end of the load 3, and a current would flow from the collector of the phototransistor Q2-2 constituting the photocoupler 5-2 through the emitter resistor RE2. At this time, a current flows from the positive power source, also through the resistor R2 and the photo-diode Q2-2 to the negative power source.

In such a manner in the prior art circuit as shown in FIG. 4, a current flows through any one of the resistors R1 and R2 which are on the side where one of the photocouplers 5-1 and 5-2 is turned on and an unwanted current other than a necessary current flowing through the load 3 will flow, resulting in an increase in power consumption.

Therefore, the present invention has been achieved in view of the above-mentioned problem. It is an object of the present invention to provide a current switching circuit in which its power consumption is reduced by preventing an unwanted current other than necessary current for a load from flowing. It is another object to provide a current switching circuit having a simplified circuit configuration. Still further objects of the present invention will become apparent in the entire disclosure.

In order to accomplish the above-mentioned object, in a first aspect of the present invention, a load having one end which is connected to the ground and the other end which is connected to one end of each of the switches, the first switch having the other end which is connected to a positive current source and the second switch having the other end which is connected to a negative current source.

In a second aspect of the present invention, a load is connected at one end to the ground, the load is connected at other end to a connection node between collectors of phototransistors of first and second photocouplers, emitters of the phototransistors which make up the first and second photocouplers are connected to positive and negative power sources via a first and second resistors, respectively, first and second control signals are input to the first and second photocouplers, respectively, and a direction in which current flows through the load is changed over by selectively turning on any one of the first and second photocouplers.

In a third aspect of the present invention, there is provided a circuit for switching over a direction in which current flows. The circuit comprises: a load having one end which is connected to the ground; and a first transistor and a second transistor, each having a drain which is connected to the other end of the load; wherein sources of the first and second transistors are connected to a positive power source and a negative power source through a first resistor and a second resistor, respectively; and wherein a first control signal and a second control signal are input to gates of the first and second transistors, respectively, and a direction of a current flowing through the load is changed over by selectively turning on any one of the first and second transistors.

In a fourth aspect of the present invention, there is provided a circuit for switching over a direction in which current flows, wherein a load is connected at its one end to the ground; the load is connected at the other end to a connection node between collectors of phototransistors of first and second photocouplers; emitters of the phototransistors each making up the first and second photocoupler, respectively, are connected to a positive power source and a negative power source via a first resistor and a second resistor, respectively; a first control signal and a second control signal are input to the first photocoupler and the second photocoupler, respectively; and a direction in which the current flows through the load is changed over by selectively turning on any one of the first and second photocouplers. The first and second control signals are connected to cathode terminals of light emitting diodes each making up the first and second photocouplers, respectively.

PREFERRED EMBODIMENTS OF THE INVENTION

Figure 1:
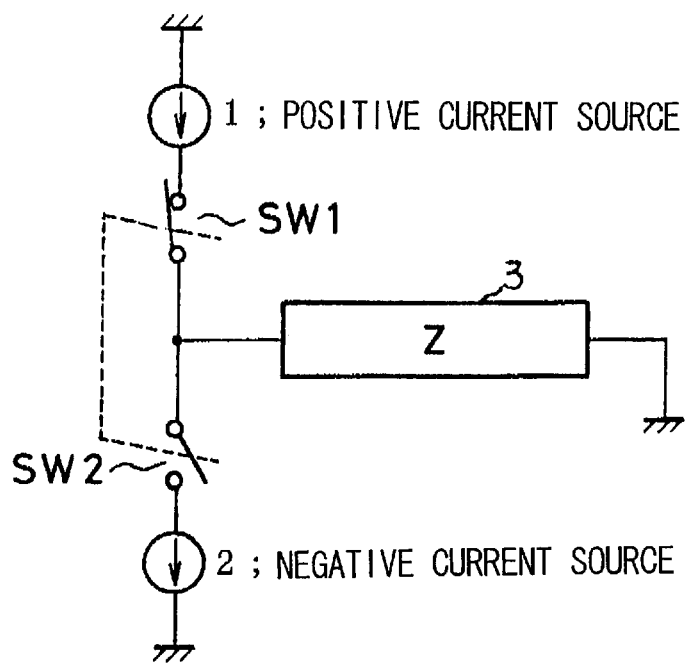
FIG. 1 A diagram showing the configuration of one embodiment of the present invention.

A mode embodying the present invention will be described. FIG. 1 is a diagram explaining a mode embodying the present invention. Referring now to FIG. 1, a two-terminal load (Z) 3 is connected at its one end to the ground and is connected at the other end to a connection node between one end of a first switch SW1 and one end of a second switch SW2. The first switch SW1 is connected at the other end to a positive current source (1) and the second switch SW2 is connected at the other end to a negative current source (2).

The first and second switches SW1 and SW2 perform switching operation for turning on or off in synchronization with each other. The direction of a current flowing through the load 3 is switched over by switching the turning on or off of the first and second switches SW1 and SW2 so that no current other than the current flowing through the load 3 is caused to flow. In other words, by turning the first switch SW1 on and the second SW2 off, a source current from the positive current source 1 is caused to flow toward the ground GND through the first switch SW1 and the load 3. On the other hand, by turning the first switch SW1 off and the second switch SW2 on, a sink current drawn from the negative current source 2 is caused to flow from the ground GND via the load 3 and the second switch SW2.

In a preferred embodiment of the present invention, the first and second switches SW1 and SW2 are formed of transistors. The load Z is connected at its one end to the ground and is connected at the other end to the connection between the collector of the first transistor (Q1) and the collector of the transistor (Q2). The emitters of the first and second transistors are connected to the positive and negative power sources through the first and second resistors (RE1, RE2) respectively. A first and second control signals (A, B) are input to the bases of the first and second transistors, respectively, for selectively turning on any one of the first and second transistor (Q1, Q2) transistor to change the direction of the current flowing through the load Z. It should be noted various types of transistors may be used according to the required characteristics such as bipolar or unipolar e.g., MOSFET, TFT etc.

In another preferred embodiment of the present invention, the first and second switches SW1 and SW2 may be made of photocouplers. The load Z is connected at its one end to the ground and is connected at the other end to the connection between the collector of the phototransistor of the first photocoupler (4) and the collector of the phototransistor of the second photocoupler (5). The emitters of the phototransistors which make up the first and second photocouplers are connected to the positive and negative power sources through the first and second resistors (RE1, RE2), respectively. First and second control signals (A, B) are input to the first and second photocouplers (4, 5) for selectively turning on any one of the first and second photocouplers to change the direction of a current flowing through the load Z.

EXAMPLES

Figure 2:
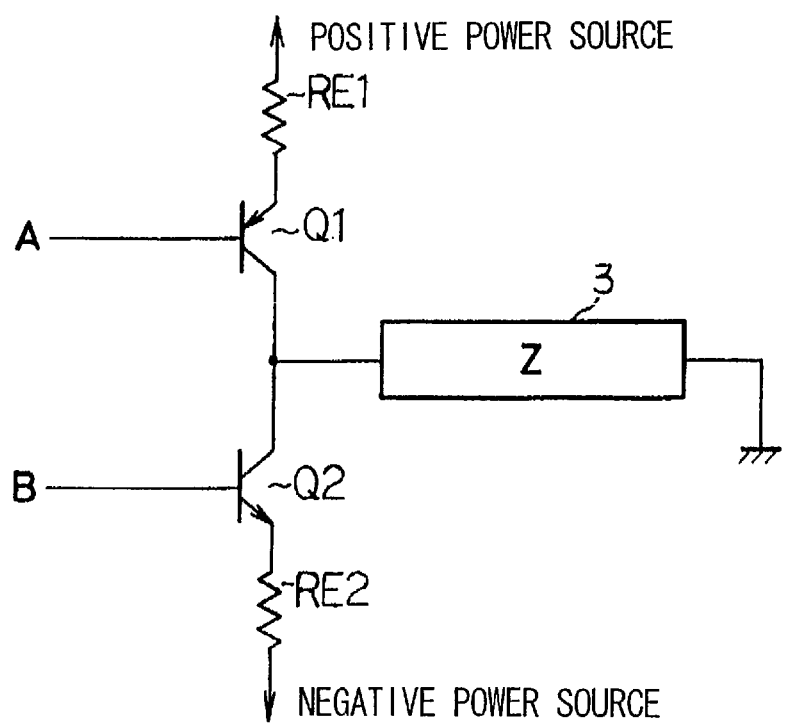
FIG. 2 A diagram showing the configuration of one embodiment of the present invention.

An example of the present invention will be described with reference to the drawings. FIG. 2 is a diagram showing the configuration of one example of the present invention. Referring now to FIG. 2, a two-terminal load (impedance Z) 3 is connected at one end to the ground GND and is connected at the other end to a connection node between the collector of a PNP transistor Q1 and the collector of an NPN transistor Q2. The PNP transistor Q1 has an emitter which is connected to a positive power source through an emitter resistor RE1. The NPN transistor Q2 has an emitter which is connected to a negative power source through an emitter resistor RE2. Control signals A and B are applied to the bases of the PNP and NPN transistors Q1 and Q2. A current flowing through the load 3 is switched by turning on any one of the transistors Q1 and Q2 for preventing the current other than the current flowing through the load 3 from flowing.

When the control signal A becomes such a potential that it is enough to turn the PNP transistor Q1 on and the transistor Q1 is not saturated (the potential which is slightly higher than the GND level) or when the control signal B becomes such an potential that it is enough to turn the NPN transistor Q2 on and the transistor Q2 is not saturated (the potential which is slightly lower than the GND level, a positive current or negative current will flow through the load 3. When the PNP transistor Q1 is turned on, a current flows from the positive power source through the emitter resistor RE1, and the collector of the transistor Q1 and the load 3 to the GND. On the other hand, when the NPN transistor Q2 is turned on, a current flows from GND through the load 3 and the emitter resistor RE2 of the NPN transistor Q2 to the negative power source. The direction in which the current flows through the load 3 is changed over. It is of course that bipolar transistors which are used for the transistors Q1 and Q2 may be replaced with FETs. The control signals A and B are supplied in such a manner that the transistors Q1 and Q2 are not turned on simultaneously.

Figure 3:
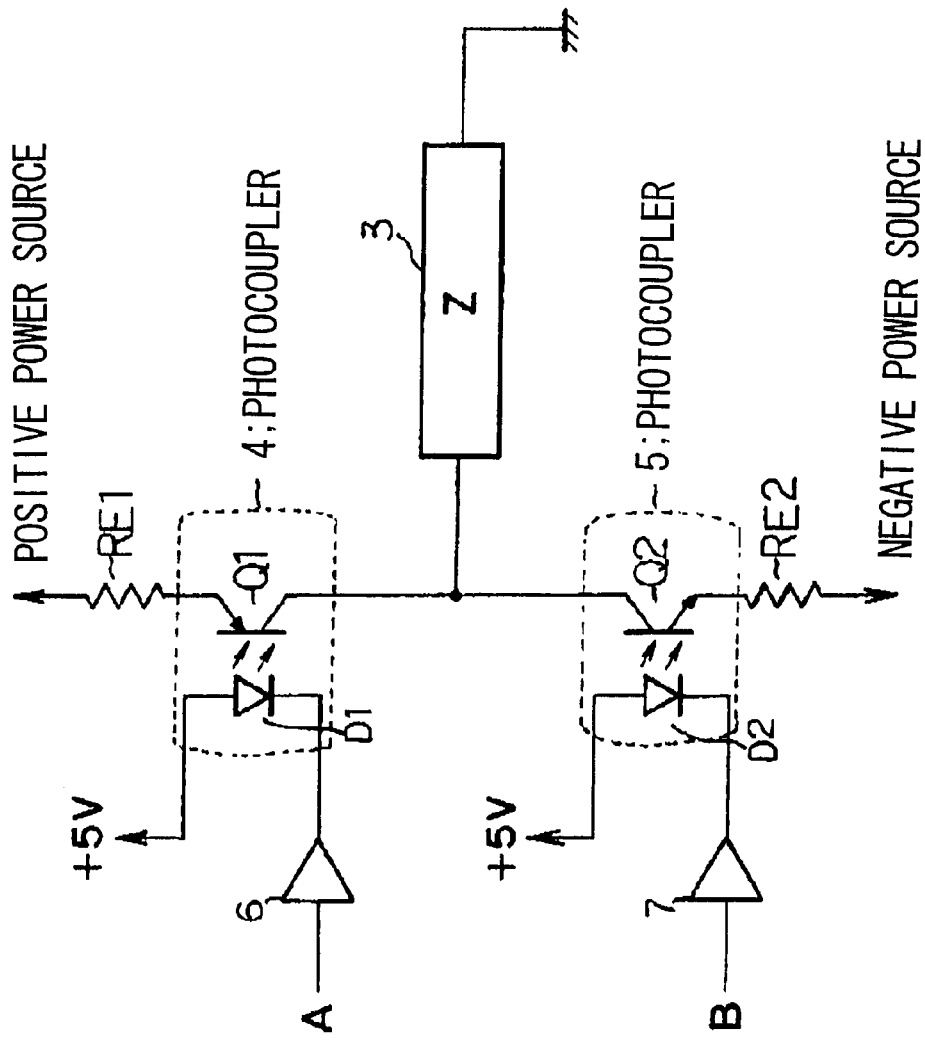
FIG. 3 A diagram showing the configuration of a further embodiment of the present invention.
Figure 4:
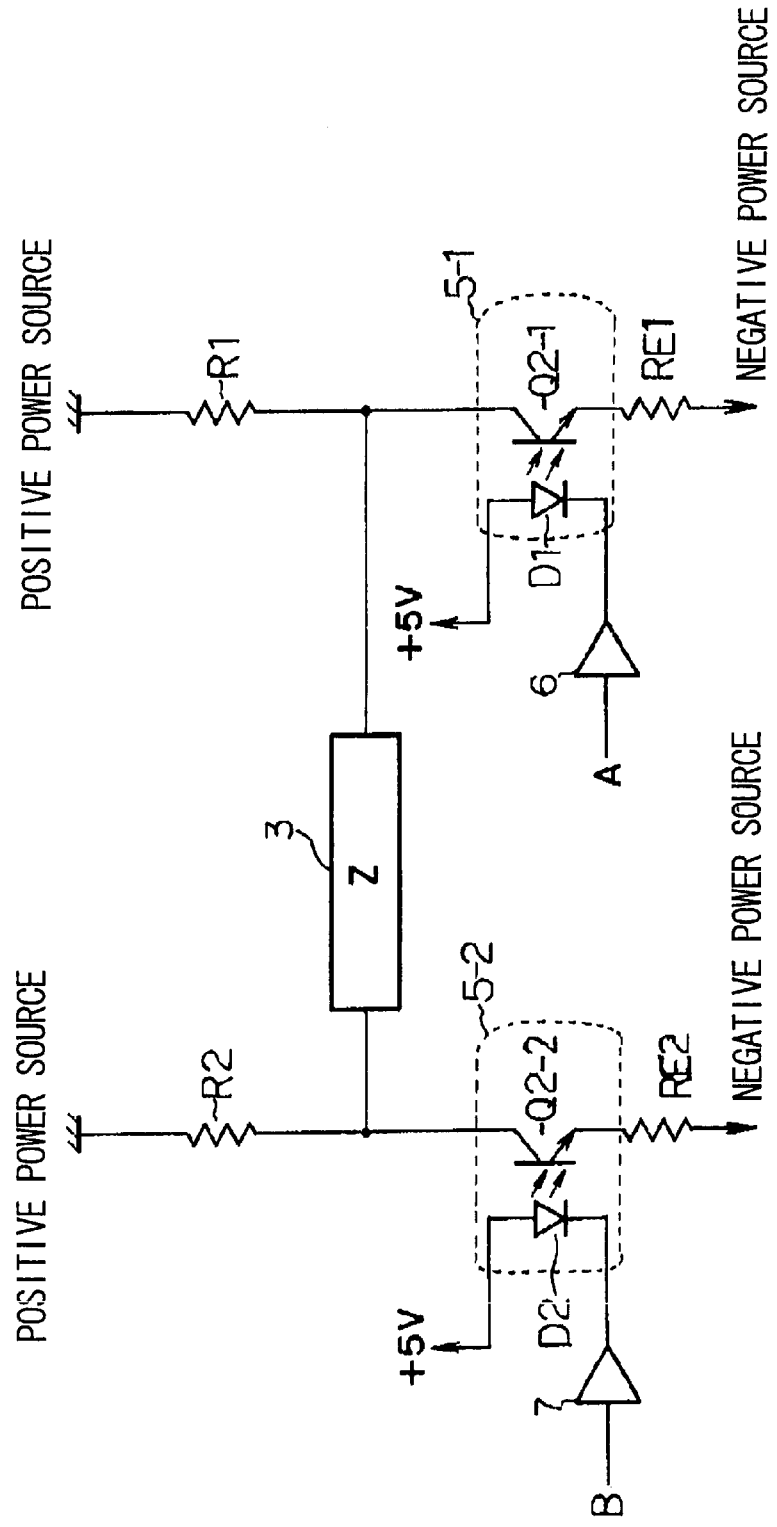
FIG. 4 A diagram showing the configuration of a prior art circuit for switching direction of current.

FIG. 3 is a diagram showing the configuration of second example of the present invention. Referring now to FIG. 3, a two-terminal load 3 is connected at one end to the GND and is connected at the other end to the collector of a phototransistor Q1 which makes up a PNP type photocoupler 4 and the collector of a phototransistor Q2 which makes up an NPN type photocoupler 5. The phototransistor Q1 which makes up the PNP photocoupler has an emitter which is connected to a positive power source through an emitter resistor RE1. The phototransistor Q2 which constitutes the NPN type photocoupler 5 has an emitter which is connected to a negative power source through an emitter resistor RE2. Light emitting diodes D1 and D2 of the photocouplers 4 and 5 have anodes to which +5 V is applied and have cathodes which are connected to outputs of drive circuits 6 and 7, respectively. When the input signal A assumes a Low level, a current flows through the PNP type photocoupler 4 so that the phototransistor Q1 is turned on and a current flows from the collector of the phototransistor Q1 through the load 3 to the GND. On the other hand, when the input signal B assumes a Low level, a current flows through the NPN photocoupler 5 so that the phototransistor Q2 is turned on and a current flows from the GND through the load 3 to the collector of the phototransistor Q2. In such a manner, the direction in which the current flows through the load 3 is changed over. The photocouplers are not limited to the configuration using bipolar transistors as drive units, but may be replaced with FETs. In the second example of the present invention, the input signals A and B can be activated with the same logic (circuit). In the second example of the present invention, the side (part of the circuit) to which the input signals A and B are applied can be isolated from the side of load.

The meritorious effects of the present invent ion are summarized as follows.

Since the circuit of the present invention can be driven with only a current flowing through the load as mentioned above, it is possible to design a circuit having a low power consumption and to simplify the circuit configuration.

When the photocouplers are used as switches, it is possible to control the circuit by supplying control signals having the same logic and to simplify the configuration of the control circuit.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A circuit for switching over a direction in which current flows, comprising:

a first switch and a second switch; and a load having one end which is connected to the ground and the other end which is connected to one end of each of said first and second switches, said first switch having the other end which is connected to a positive current source and said second switch having the other end which is connected to a negative current source.

2. A circuit for switching over a direction in which current flows, comprising:

a load having one end which is connected to the ground; and a first transistor and a second transistor, each having a collector which is connected to the other end of said load;

wherein emitters of said first and second transistors are connected to a positive power source and a negative power source through a first resistor and a second resistor, respectively; and wherein a first control signal and a second control signal are input to bases of the first and second transistors, respectively, and a direction of a current flowing through the load is changed over by selectively turning on any one of said first and second transistors.

3. A circuit for switching over a direction in which current flows, comprising:

a load having one end which is connected to the ground; and a first transistor and a second transistor, each having a drain which is connected to the other end of said load;

wherein sources of said first and second transistors are connected to a positive power source and a negative power source through a first resistor and a second resistor, respectively: and wherein a first control signal and a second control signal are input to gates of the first and second transistors, respectively, and a direction of a current flowing through the load is changed over by selectively turning on any one of said first and second transistors.

4. A circuit for switching over a direction in which current flows, wherein a load is connected at its one end to the ground;

the load is connected at the other end to a connection node between collectors of phototransistors of first and second photocouplers;

emitters of the phototransistors each making up said first and second photocoupler, respectively, are connected to a positive power source and a negative power source via a first resistor and a second resistor, respectively;

a first control signal and a second control signal are input to the first photocoupler and the second photocoupler, respectively; and a direction in which the current flows through said load is changed over by selectively turning on any one of said first and second photocouplers.

5. A circuit for switching over a direction in which current flows, as defined in claim 4, wherein said first and second control signals are connected to cathode terminals of light emitting diodes each making up said first and second photocouplers, respectively.

6. A circuit as defined in claim 1, wherein said first and second switches are alternatively turned on and off in synchronism with each other.

7. A circuit as defined in claim 1, wherein said first and second switches are turned on and off so as to allow a current to flow alternatively in directions opposed to each other.

8. A circuit as defined in claim 1 wherein said first and second switches comprise a bipolar transistor, respectively.

9. A circuit as defined in claim 1, wherein said first and second switches comprise a FET, respectively.

10. A circuit as defined in claim 1, wherein said first and second switches each comprise a photocoupler.

11. A circuit as defined in claim 10, wherein said photocoupler comprises a pair of photodiode and a transistor photo-coupled to the photodiode.

* * * * *